United States Patent
Zhang et al.

(10) Patent No.: US 6,227,679 B1
(45) Date of Patent: May 8, 2001

(54) LED LIGHT BULB

(76) Inventors: Zhou Kui Zhang, Rm 103, Hai Bing Er Chun 43; Zhang Qi Xiang, Rm 302, Xing Er Chun 13, both of Xing Huo Farm, Shanghai (CN)

( * ) Notice: Subject to any disclaimer, the term of this patent is extended or adjusted under 35 U.S.C. 154(b) by 0 days.

(21) Appl. No.: 09/397,399

(22) Filed: Sep. 16, 1999

(51) Int. Cl.[7] .................................................. F21S 13/14
(52) U.S. Cl. ........................... 362/236; 362/252; 362/800
(58) Field of Search .................................. 362/235, 236, 362/238, 240, 244, 252, 800, 231, 249; 340/815.45, 815.73

(56) References Cited

U.S. PATENT DOCUMENTS

| | | |
|---|---|---|
| 5,561,346 | 10/1996 | Byrne . |
| 5,726,535 | 3/1998 | Yan . |
| 5,774,098 | 6/1998 | Kawashima et al. . |
| 5,803,579 | 9/1998 | Turnbull et al. . |
| 5,806,965 | * 9/1998 | Deese .................................. 362/800 |
| 5,848,837 | 12/1998 | Gustafson . |
| 5,850,126 | 12/1998 | Kanbar . |
| 5,865,529 | 2/1999 | Yan . |
| 5,931,570 | * 8/1999 | Yamuro ............................... 362/800 |
| 5,947,588 | * 9/1999 | Huang ................................ 362/235 |

* cited by examiner

Primary Examiner—Y. Quach
(74) Attorney, Agent, or Firm—Watts, Hoffman, Fisher & Heinke, CO, LPA

(57) ABSTRACT

An LED light bulb for use as an indicator or warning lamp comprises a support structure; a generally circular and planar disc attached to the support structure, wherein the disc is a printed circuit board and is perpendicularly oriented with respect to the structure. A plurality of interconnected LEDs are concentrically mounted on the disc wherein a portion of the LEDs are outwardly splayed at an angle away from a central axis point of the disc so that the LEDs collectively transmit light having about the same light intensity at viewing angles from about 0° to about 360° about the disc. The LED light bulb has circuitry means for providing a current to the LEDs.

10 Claims, 1 Drawing Sheet

LED LIGHT BULB

FIELD OF INVENTION

The present invention relates to light bulbs. More specifically, the invention relates to light bulbs comprised of light emitting diodes (LED). The LED light bulb permits a 360° field of view wherein the light intensity is about the same for all viewing angles.

BACKGROUND OF THE INVENTION

Incandescent light bulbs are commonly used for indicator lamps, task lamps, general lighting, decorative lamps, warning lamps, traffic lamps and the like. However, incandescent bulbs are generally inefficient in terms of energy use and subject to frequent replacement due to their limited lifetime. Significant savings can be made by the use light bulbs wherein the source of light is from light emitting diodes (LED). LEDs consume a fraction of the energy used to illuminate incandescent bulbs and last much longer.

The problem with LEDs, without special light dissipating optics, is that the light intensity varies as a function of viewing angle. As shown in FIG. 1, the maximum light intensity is generally observed when the viewing angle is 0° or head-on and the least at 90° or when you view the device from the side. Thus, light bulbs made from LEDs of this type have the problem of being viewed with sufficient intensity at various viewing angles other than head-on.

U.S. Pat. No. 5,561,346 to Byrnes is directed to a lamp comprising a plurality of LEDs extending from opposed rounded surfaces to project light radially about the lamp. The patent requires special reflecting optics for projecting the light 360° around the lamp.

Accordingly, it is an object of this invention to provide an LED light bulb that can be viewed from various viewing angles wherein the light intensity is constant without the need for special light dissipating optics or special light reflecting optics.

SUMMARY OF THE INVENTION

The present invention is directed to an LED light bulb for use as an indicator lamp, task lamp, general lighting, decorative lamp, traffic lamp or warning lamp. The LED light bulb generally comprises a base portion and a generally circular and flat disc perpendicularly oriented and attached to the base portion. The disc is a printed circuit board with a plurality of interconnected LEDs concentrically mounted on the disc wherein a portion of the LEDs are outwardly splayed at an angle away from a center axis point of the disc. The LEDs, when energized, collectively transmit light 360 degrees about the surface of the disc. The light intensity is about the same for different viewing angles. The LED light bulb includes circuitry means for providing a current to the LEDs.

In a preferred embodiment, the LED light bulb comprises a conical housing wherein the housing has an interior support structure for mounting the circuit board. Preferably, a portion of LEDs are splayed outwardly away from the central axis point at angles of about 20 to about 80 degrees from the disc. Preferably, the portion of LEDs that are outwardly splayed are at angles of about 55 to 60 degrees from the disc.

The LED light bulb may further comprise a light transmissive cap attached to the housing wherein the light transmissive cap may be colored. Alternatively, the LEDs emits light at a wavelength that is a function of its material and dopants.

Circuitry means preferably comprises a full wave rectifier for converting an AC current into a DC current. The LEDs may be connected in parallel or in series. The inventive LED light bulbs economically consume less than 1 watt of energy when in use.

Other embodiments of the invention are contemplated to provide particular features and structural variants of the basic elements. The specific embodiments referred to as well as possible variations and the various features and advantages of the invention will become better understood when considered in connection with the accompanying drawings and the detailed description that follows.

DETAILED DESCRIPTION

The present invention is directed to an LED light bulb comprised of a plurality of LEDs that permit a 360° field of view having about the same light intensity for various viewing angles. The present LED light bulbs are ideally suited for traffic lamps, task lamps, general lighting, decorative lamps, indicator lamps, warning lamps and the like wherein the viewing angle varies. Preferably, the LED light bulbs do not have any special light dissipating optics nor light reflecting optics. Accordingly, the LED light bulbs of the present invention are inexpensive to manufacture and operate.

In general, the individual LEDs operate at voltage levels from about 1.1 to about 3.3 volts, which makes them completely compatible with solid state circuits and operationally more efficient than incandescent bulbs. They have a fast response time (nanoseconds) and offer good contrast ratios for visibility. The power requirement is typically from 10 to 150 mW with a lifetime greater than about 100,000 hours. Advantageously, the total wattage consumption of an LED light bulb containing 6 LEDs made in accordance with the present invention is below 1 watt. This amounts to considerable savings in terms of energy requirements compared to the incandescent bulb.

Figure 2:
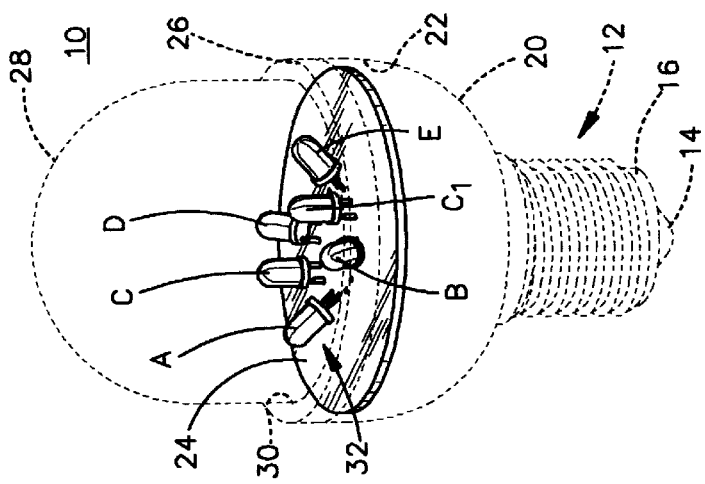
FIG. 2 is a perspective view of an LED light bulb according to the present invention.
Figure 1:
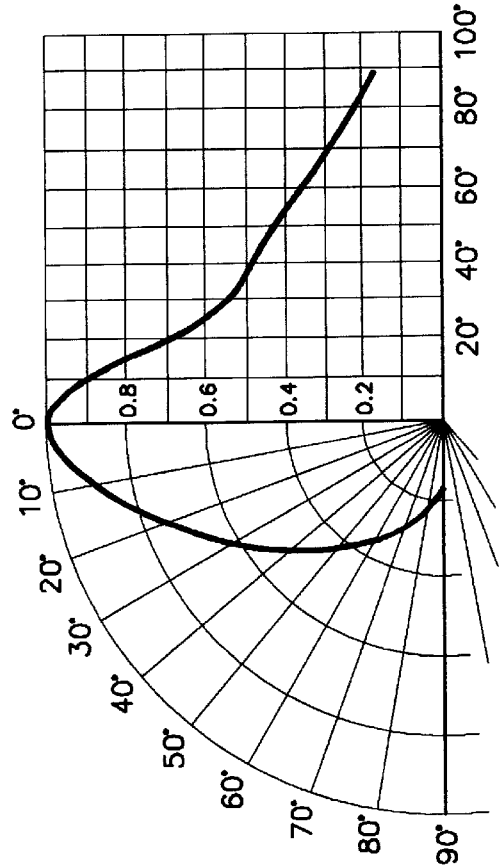
FIG. 1 is a graphical view showing the light intensity versus the viewing angle of an individual LED.
Figure 3:
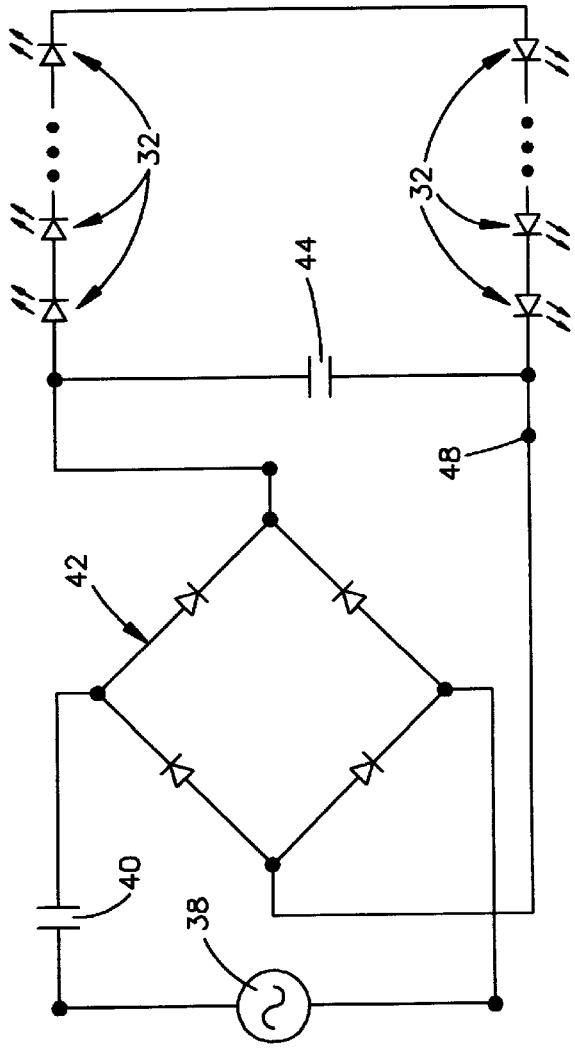
FIG. 3 is an electrical circuit diagram in schematic form in accordance with the present invention.

Referring now to the drawings and to FIG. 2 in particular, one embodiment of an LED light bulb constructed in accordance with the present invention is designated generally by reference numeral 10. The LED light bulb includes a screw assembly 12 having an inner terminal 14 and an externally threaded outer terminal 16. The screw assembly is preferably made from an electrically conductive metal according to standard practices known to those skilled in the art. The screw assembly is adapted to be screwed into a standard incandescent light bulb socket (not shown) wherein the socket is connected to an AC power line. Alternatively, the LED light bulb could be adapted to fit into any socket wherein AC current is supplied. For example, the lower portion could be configured as a standard two or three prong plug or can be configured to snap into a socket.

Extending from the screw assembly is a conical base portion 20. The conical base portion includes an inner support surface (not shown) for securing a generally circular and flat printed circuit board 24. An inner shelf protrusion (not shown) circumscribes the conical base portion for attaching an optional light transmissive cap 28. Preferably, the optional transmissive cap has a corresponding ribbed circumscribing structure (not shown) such that the cap can be press fit and fixedly attached to the base. Alternatively, the cap can be secured by glue, an epoxy resin, silicone or the like, to an inner surface of the conical base. Depending on the desired application, the light transmissive cap can be colored. For example, the light transmissive cap could be green, yellow or red for use in traffic lights. Preferably, the conical base portion and the optional light transmissive cap are made from a plastic material, such as polycarbonate.

The printed circuit board 24 comprises the circuitry for energizing the individual LED lights. The LEDs are generally designated 32. The printed circuit board is a generally circular and flat disc made according to practices well known in the industry. The disc is preferably affixed to the inner support surface of the conical base portion such that the disc is perpendicularly oriented with respect to the surface. In a preferred embodiment, the flat circuit board is about 2 inches in diameter and comprises a top surface and a bottom surface. Depending on the application, the diameter of the circuit board can be smaller or larger than the 2 inches as will be apparent to those skilled in the art in view of this disclosure. The bottom surface comprises the circuitry as shown schematically in FIG. 4. The top surface of the board comprises the LEDs that are connected to the circuitry located on the bottom surface through holes drilled in the board. The LEDs can be connected in parallel or in series. In the LED light bulb having a 2 inch diameter circuit board, the LEDs can vary from 6 to about 21. Wires (not shown) extending from the inner and outer terminals of the screw assembly are connected to the circuitry.

Each LED is a semiconductor PN junction diode that, when forward biased, emits light at a wavelength that is a function of its material and dopants. For instance, a crystal structure of gallium arsenide (GaAs) permits nonvisible infrared emission. Phosphorous added to GaAs to form gallium arsenide phosphide (GaAsP) shifts the emission to the visible red region. Gallium phosphide (GaP) emits in the red, yellow, and green regions. Aluminum gallium arsenide on GaAsP produces brighter (high intensity) red and yellow light emission. GaP on GaP emits high intensity green. The present invention is directed to the use of LEDs that emit light, preferably, in the visible spectrum. LEDs of various wavelengths without special light dissipating optics are commercially available at various wavelengths and light intensities from numerous sources such as those available from Hiyosh Company in Japan. It is understood that LEDs with special light dissipating optics would work in the present invention. However, the cost is generally higher than the LEDs without special optics and since the intended user is generally concerned with cost, these LEDs are less preferred.

For illustrative purposes only, an LED light bulb containing six LEDs will be discussed. As shown in FIG. 2, a portion of the LEDs are outwardly splayed away from a central axis point of the circular disc. LEDs A, B, D, and E are outwardly splayed at an angle of about 55–60° relative to the disc. LEDs C and C' are perpendicular with respect to the board. It is believed that the outwardly splayed LEDs with a 55–60 degree splay angle in combination with the perpendicularly oriented LEDs permit the light intensity to be about the same for all viewing angles. LED light bulbs having greater numbers of LEDs or larger diameter circuit boards will have the LEDs splayed at angles from about 20° to about 80° from the board so as to maximize light intensity at the desired viewing angles so that the overall intensity of the bulb is about the same for all viewing angles.

FIG. 4 depicts an electrical circuit diagram in schematic form of the LED light bulb having the 6 individual LEDs. In operation, an AC voltage 38 is applied to the circuit. It should be understood by those skilled in the art that the voltage can vary. For example, the voltage could be 120 volts with a 60 hertz frequency as is standard in the United States, or could be 220 volts with a frequency of 50 hertz as is standard in some other countries. The AC current first passes through a capacitor 40. Preferably, the capacitor is a nonpolarity type capacitor wherein the capacitor functions by lowering the amount of voltage passing through the circuit. Those skilled in the art will appreciate that the amount of capacitance is a function of the amount of LEDs in the circuit and incoming voltage levels. The current then passes through a rectifier 42 for converting the attenuated AC current to a DC current. The rectifier can be a rectifier diode, a bridge rectifier or any other rectifier that is suitable for converting the incoming AC voltage to DC and will be apparent to those of ordinary skill in the art in view of this disclosure. Preferably, a full wave rectifier is used. The DC current then passes through a filtering capacitor 44. The filtered DC current is then used to illuminate the LEDs 32, shown arranged in series. One skilled in the art would appreciate that the LEDs could be arranged in parallel.

As discussed above, the values for the circuit are dependent on the incoming voltage and amount of LEDs used in the display. For illustrative purposes only, assume the voltage is 120 volts at 60 hertz and that the display consists of 21 LEDs with a working voltage and current of each LED at 1.8 volts, 20 mA, respectively. Capacitor 40 would have a capacitance of 0.764 uF and the AC voltage between the rectifier and point 48 would be at 37.8 volts.

The foregoing description of the preferred embodiments of the invention have been presented for purposes of illustration and description. It is not intended to be exhaustive or to limit the invention to the precise forms disclosed. Obvious modifications or variations are possible in light of the above teachings. The embodiments were chosen and described to provide the best illustration of the principles of the invention and its practical applications to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

We claim:

1. An LED light bulb for use as an indicator lamp, task lamp, general lighting, decorative lamp, and traffic lamp, warning lamp, said LED light bulb comprising:

an opaque conical base portion wherein said base portion includes a first circular opening and a second circular opening, the first circular opening having a larger diameter than the second circular opening;

a generally circular and planar disc inserted into the first opening and affixed to the base portion, wherein said disc is a printed circuit board having a top planar surface and a bottom planar surface and is perpendicularly oriented with respect to base portion;

a plurality of interconnected LEDs concentrically mounted on the top surface of said disc wherein at least one of said LEDs is perpendicularly oriented with respect to the disc and a portion of said LEDs is outwardly splayed at an angle relative to said disc and away from a central axis point of said disc for transmission of light having about the same light intensity at different viewing angles;

a threaded socket attached to the second opening of the conical base portion; and circuitry means located on the bottom surface of said disc and connected to the socket for providing a current to said LEDs.

2. The LED light bulb of claim 1 wherein said angle splayed outwardly away from the disk is from about 20 to about 80 degrees.

3. The LED light bulb of claim 1 wherein said angle splayed outwardly away from the disk is from about 50 to about 70 degrees.

4. The LED light bulb of claim 1 wherein said angle splayed outwardly away from the disk is about 55 to 60 degrees.

5. The LED light bulb of claim 1 further comprising a light transmissive cap attached to said, base portion.

6. The LED light bulb according to claim 5 wherein said light transmissive cap is colored.

7. The LED light bulb according to claim 1 wherein said LEDs are connected in parallel.

8. The LED light bulb according to claim 1 wherein said LEDs are connected in series.

9. The LED light bulb according to claim 1 wherein said circuitry means comprises a full wave rectifier for converting an AC current into a DC current.

10. The LED light bulb of claim 1 wherein said LEDs emit visible light at wavelengths corresponding to a selected one of a red, green, blue, yellow, amber and white color.

* * * * *

UNITED STATES PATENT AND TRADEMARK OFFICE
CERTIFICATE OF CORRECTION

PATENT NO. : 6,227,679 B1  Page 1 of 1
DATED : May 8, 2001
INVENTOR(S) : Zhang et al.

It is certified that error appears in the above-identified patent and that said Letters Patent is hereby corrected as shown below:

Title page,
Kindly insert the following assignee name and residence data:
-- Assignee: Mule Lighting, Inc.
     Providence, Rhode Island 02908

Shanghai Baoshan Import & Export
     Trade Corporation, Ltd.
     Shanghai, China --

Signed and Sealed this

Second Day of October, 2001

Attest:

NICHOLAS P. GODICI
*Attesting Officer*  *Acting Director of the United States Patent and Trademark Office*